US007076698B2

(12) United States Patent
Busking

(10) Patent No.: US 7,076,698 B2
(45) **Date of Patent: *Jul. 11, 2006**

(54) VECTOR MONITOR, RELATED METHOD OF CONTROLLING A TRANSMITTER AND TRANSMITTER EMPLOYING THE SAME

(75) Inventor: Erik B. Busking, Den Haag (NL)

(73) Assignee: Agere Systems, Inc., Allentown, PA (US)

( * ) Notice: Subject to any disclaimer, the term of this patent is extended or adjusted under 35 U.S.C. 154(b) by 468 days.

This patent is subject to a terminal disclaimer.

(21) Appl. No.: 10/442,623

(22) Filed: May 21, 2003

(65) Prior Publication Data

US 2004/0237007 A1 Nov. 25, 2004

(51) Int. Cl.
*G06F 11/00* (2006.01)

(52) U.S. Cl. ........................................ 714/704; 714/47

(58) Field of Classification Search ................ 455/126; 359/337; 324/76.78; 375/296, 297; 714/700, 714/704, 47

See application file for complete search history.

(56) References Cited

U.S. PATENT DOCUMENTS

| | | | | |
|---|---|---|---|---|
| 6,047,168 | A * | 4/2000 | Carlsson et al. | 455/126 |
| 6,125,266 | A * | 9/2000 | Matero et al. | 455/126 |
| 6,760,149 | B1 * | 7/2004 | Roberts et al. | 359/337 |
| 6,794,858 | B1 * | 9/2004 | Ishii | 324/76.78 |
| 6,898,252 | B1 * | 5/2005 | Yellin et al. | 375/296 |
| 6,909,757 | B1 * | 6/2005 | Justice et al. | 375/297 |

FOREIGN PATENT DOCUMENTS

| | | |
|---|---|---|
| EP | 0 598 585 A2 | 5/1994 |
| WO | WO 01/24472 A1 | 4/2001 |
| WO | WO 01/56147 A1 | 8/2001 |

* cited by examiner

*Primary Examiner*—David Ton

(57) ABSTRACT

The present invention is directed to a vector monitor for use with a transmitter employing in-phase and quadrature phase input and feedback signals, and a method of controlling a transmitter. In one embodiment, the vector monitor includes an error detection circuit configured to provide first and second components of an error signal based on the input and feedback signals. Additionally, the vector monitor includes a comparator circuit, coupled to the error detection circuit, configured to compare a resultant vector of the first and second components to a comparison boundary and control a power level of the transmitter based on the comparison.

20 Claims, 8 Drawing Sheets

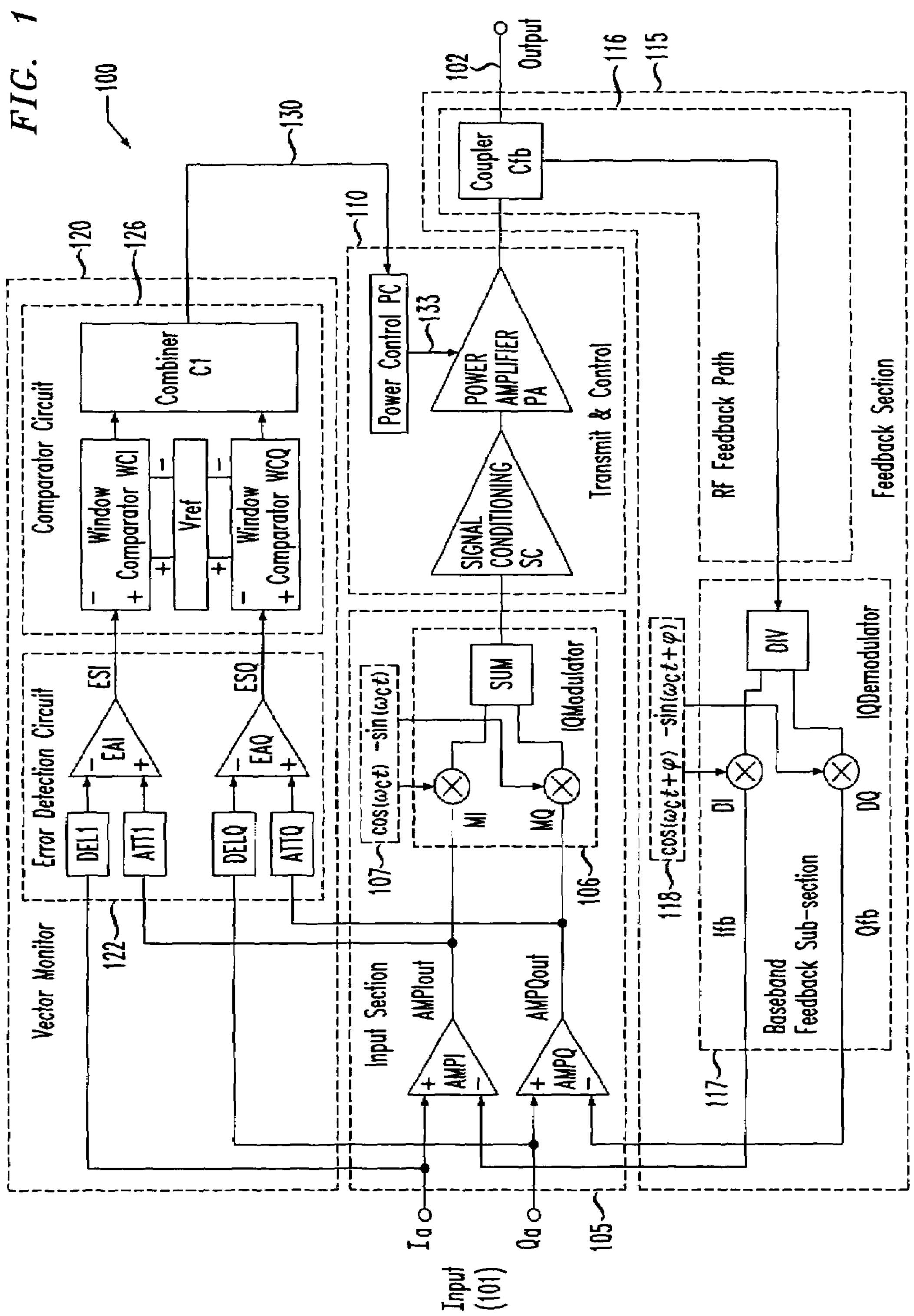
FIG. 1
100
Vector Monitor
120
126
Comparator Circuit
Combiner C1
130
Window Comparator WCI
Window Comparator WCQ
Vref
Error Detection Circuit
ESI
ESQ
EAI
EAQ
DEL1
ATT1
DELQ
ATTQ
122
Input Section
AMPIout
AMPQout
AMPI
AMPQ
Ia
Qa
Input (101)
105
106
107
cos(ωct)
-sin(ωct)
MI
MQ
SUM
IQModulator
110
Power Control PC
133
POWER AMPLIFIER PA
SIGNAL CONDITIONING SC
Transmit & Control
102
Output
116
115
Coupler Cfb
RF Feedback Path
Feedback Section
DIV
118
cos(ωct+φ)
-sin(ωct+φ)
DI
DQ
IQDemodulator
Ifb
Qfb
Baseband Feedback Sub-section
117

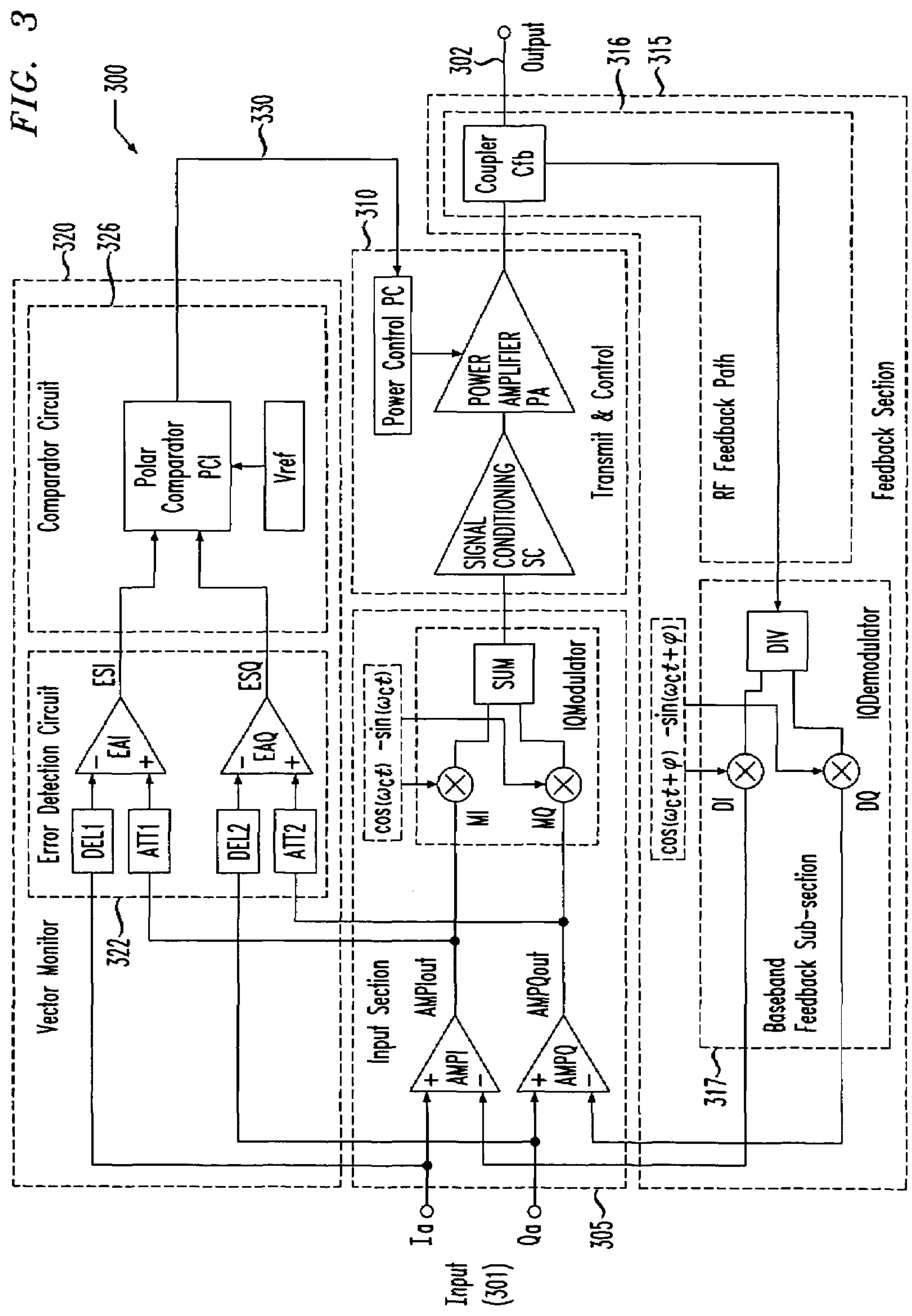
FIG. 3
300
330
Vector Monitor
320
326
Comparator Circuit
Polar Comparator PCI
Vref
Error Detection Circuit
322
ESI
ESQ
EAI
EAQ
DEL1
ATT1
DEL2
ATT2
310
Power Control PC
POWER AMPLIFIER PA
SIGNAL CONDITIONING SC
Transmit & Control
Input Section
AMPIout
AMPQout
AMPI
AMPQ
IQModulator
SUM
MI
MQ
cos(ωct) -sin(ωct)
305
Ia
Qa
Input (301)
302
Output
316
315
Coupler Cfb
RF Feedback Path
Feedback Section
DIV
IQDemodulator
cos(ωct+φ) -sin(ωct+φ)
DI
DQ
Baseband Feedback Sub-section
317

VECTOR MONITOR, RELATED METHOD OF CONTROLLING A TRANSMITTER AND TRANSMITTER EMPLOYING THE SAME

CROSS REFERENCE TO RELATED APPLICATION

This application is related to U.S. patent application Ser. No. 10/442,738 entitled "Comparator Circuit, Related Method of Comparing a Vector to Comparison Boundaries and Transmitter Employing the Same," to Erik B. Busking, filed concurrently herewith, which is commonly assigned with the present invention and incorporated herein by reference as if reproduced herein in its entirety.

TECHNICAL FIELD OF THE INVENTION

The present invention is directed, in general, to communication systems and, more specifically, to a vector monitor, a method of controlling a transmitter and a transmitter employing the same.

BACKGROUND OF THE INVENTION

As the demand for high-speed telecommunications systems increases, more signal bandwidth is required for use therein. While attempting to augment the available bandwidth of channels within a given transmission frequency range (e.g., 2.5 to five gigahertz range), the combined use of amplitude and phase modulation such as may be found with orthogonal frequency division multiplex (OFDM) signals, has proven difficult to effectively implement. More specifically, the delivery of improved spectral efficiency of transmitted signals in linear modulation schemes typically undergoes significant distortion of both phase and amplitude when the modulated signals are boosted by a power amplifier for transmission to a receiver. The distortion is especially prevalent in transmitters that employ power efficient, but nonlinear, power amplifiers. As a result, linearization techniques have been developed to produce a desirable trade-off between a transmitter's efficiency and its linearity.

Among the more popular linearization techniques employable with transmitters is Cartesian feedback linearization. In this type of linearization technique, a Cartesian feedback section is provided after the power amplifier, which would otherwise introduce undesirable distortion into a modulated output signal. The Cartesian feedback section provides baseband in-phase and quadrature phase feedback signals that are demodulated from the output of the power amplifier. These signals are, by means of operational amplifiers, compared to in-phase and quadrature phase input signals of the power amplifier to provide a "predistortion" into the modulated signal prior to the power amplifier so that distortion introduced by the power amplifier is thereby offset achieving the desired linearization.

This predistortion essentially straightens or linearizes the nonlinear saturating transfer characteristic of the power amplifier and reduces the overall distortion. If a required power output level of the power amplifier is too large, however, the power amplifier may limit or clip its output signal thereby introducing a distortion level that Cartesian feedback linearization cannot fully correct. Unfortunately, the high operational efficiency of the power amplifiers usually necessitates an operational level that approaches the point of limiting or clipping, thereby presenting an important design and operational dilemma. Additionally, changes in an output load associated with the power amplifier may also cause changes in both loop gain and loop phase, which may lead to feedback loop instability including oscillation.

Accordingly, what is needed in the art is a way that effectively controls a power level associated with a transmitter employing Cartesian input and feedback signals to allow power amplifier efficiency while reducing distortion.

SUMMARY OF THE INVENTION

To address the above-discussed deficiencies of the prior art, the present invention is directed to a vector monitor for use with a transmitter employing in-phase and quadrature phase input and feedback signals. In one embodiment, the vector monitor includes an error detection circuit configured to provide first and second components of an error signal based on the input and feedback signals. Additionally, the vector monitor includes a comparator circuit, coupled to the error detection circuit, configured to compare a resultant vector of the first and second components to a comparison boundary and to control a power level of the transmitter based on the comparison.

In another aspect, the present invention provides a method of controlling a transmitter employing in-phase and quadrature phase input and feedback signals. The method includes providing first and second components of an error signal based on the input and feedback signals. The method also includes comparing a resultant vector of the first and second components to a comparison boundary and controlling a power level of the transmitter based on the comparison.

The present invention also provides, in yet another aspect, a transmitter that includes an input section having first and second operational amplifiers that receive in-phase and quadrature phase input and feedback signals and provide first and second output signals, respectively. The transmitter also includes a feedback section having in-phase and quadrature phase feedback signals and a power amplifier that employs the input and feedback sections. The transmitter further includes a vector monitor including an error detection circuit that receives the input and output signals and provides first and second components of an error signal based thereon. The vector monitor also includes a comparator circuit, coupled to the error detection circuit, that compares a resultant vector of the first and second components to a comparison boundary and controls a power level of the power amplifier based on the comparison.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 1 illustrates a system diagram of an embodiment of a transmitter employing in-phase and quadrature phase input and feedback signals including an embodiment of a vector monitor constructed in accordance with the principles of the present invention;

FIG. 3 illustrates a system diagram of another embodiment of a transmitter employing in-phase and quadrature phase input and feedback signals including another embodiment of a vector monitor constructed in accordance with the principles of the present invention;

DETAILED DESCRIPTION

Figure 2:
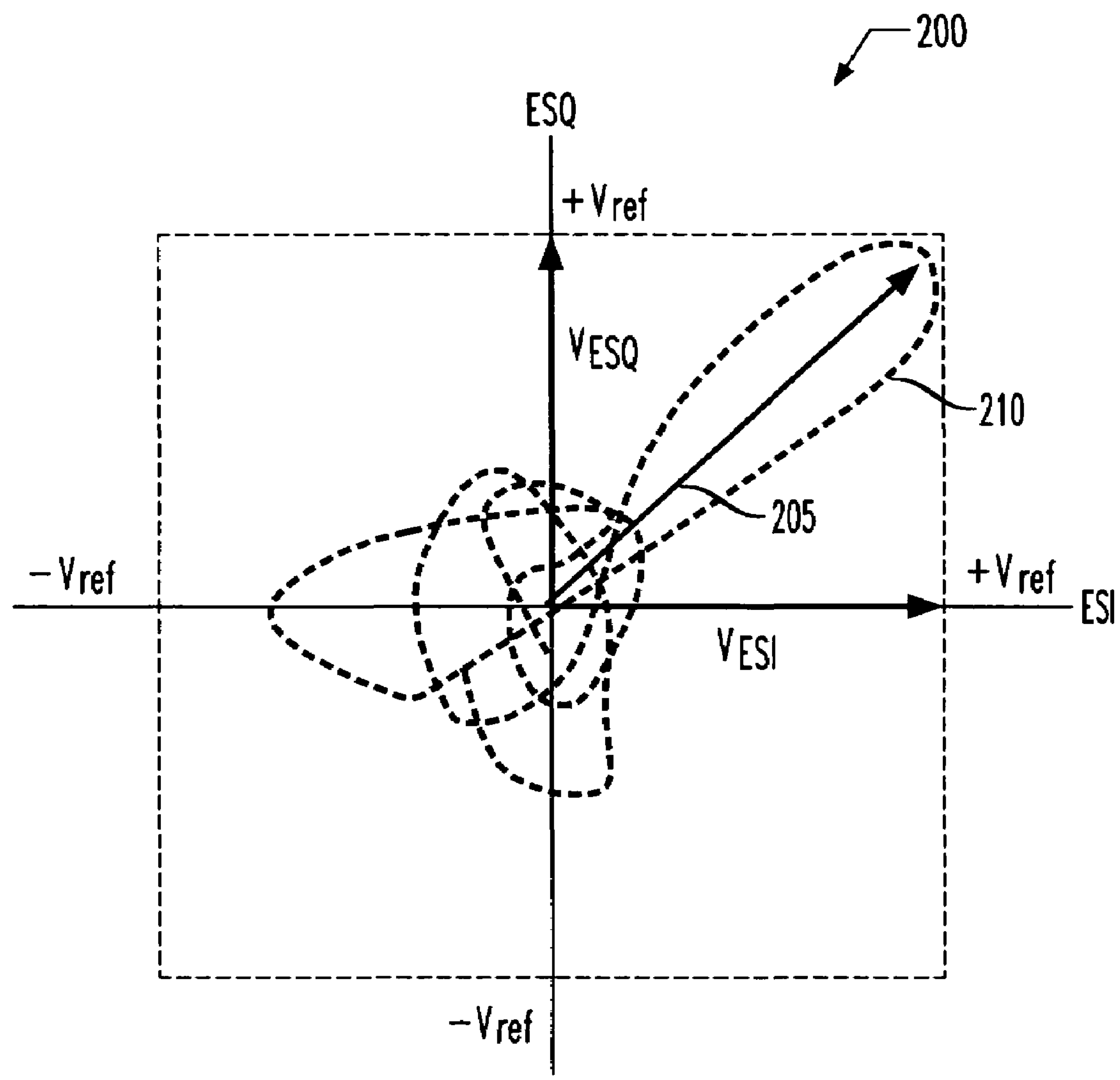
FIG. 2 illustrates a vector diagram showing a vector and an exemplary vector locus as may be associated with an embodiment of a comparator circuit employing first and second window comparators such as was discussed with respect to FIG. 1.

Referring initially to FIG. 1, illustrated is a system diagram of an embodiment of a transmitter, generally designated 100, employing in-phase and quadrature phase (Cartesian) input and feedback signals (wherein both may be referred to as in-phase and quadrature phase signals) including an embodiment of a vector monitor 120 constructed in accordance with the principles of the present invention. The transmitter 100 includes an input 101 employing in-phase and quadrature phase input signals Ia, Qa, respectively, and an output 102. The transmitter 100 further includes an input section 105 coupled to the input 101, a transmit and control section 110 coupled between the input section 105 and the output 102, and a feedback section 115, coupled between the output 102 and the input 101, having a radio frequency (RF) feedback path 116 and a baseband feedback subsection 117. The transmitter 100 still further includes the vector monitor 120 having an error detection circuit 122 and a comparator circuit 126.

In the illustrated embodiment, a baseband signal having a plurality of frequencies with a maximum of about eight megahertz is employed, which is modulated onto a carrier frequency in an exemplarily range of 2.5 to five gigahertz for transmission. The input section 105 includes first and second operational amplifiers AMPI, AMPQ whose output signals AMPIout, AMPQout are applied to an in-phase/quadrature phase (IQ) modulator 106, which employs in-phase/quadrature phase carrier signals 107 originating from a local oscillator. The in-phase/quadrature phase carrier signals 107 have an in-phase carrier signal $\cos(\omega_c t)$ and a quadrature phase carrier signal $\sin(\omega_c t)$, where $\omega_c$ is the carrier frequency. The in-phase and quadrature phase input signals Ia, Qa and in-phase and quadrature feedback signals Ifb, Qfb from the feedback section 115 are applied to the first and second operational amplifiers AMPI, AMPQ to produce respective first and second output signals AMPIout, AMPQout. The IQ modulator 106 includes an in-phase modulator MI, coupled to the in-phase carrier signal $\cos(\omega_c t)$, and a quadrature phase modulator MQ, coupled to the quadrature phase carrier signal $\sin(\omega_c t)$, whose outputs are combined in a summing circuit SUM as an input signal to the transmit and control section 110.

The RF feedback path 116 includes a coupler Cfb that provides an RF feedback signal to the baseband feedback subsection 117. In the illustrated embodiment, the baseband feedback subsection 117 consists of an IQ demodulator, which includes a divider circuit DIV coupled to an in-phase demodulator DI and a quadrature phase demodulator DQ that are also coupled to local oscillator signals 118. The local oscillator signals 118 originate from a local oscillator employing a variable phase shifter and a divider with quadrature outputs (not shown). The local oscillator signals 118 have a phase shifted in-phase carrier signal $\cos(\omega_c t+\phi)$ and a phase shifted quadrature phase carrier signal $\sin(\omega_c t+\phi)$, where $\omega_c$ is the carrier frequency and $\phi$ is a phase shift. The phase shift $\phi$ is set by the variable phase shifter. The phase shift $\phi$ is, for proper operation of the Cartesian feedback loop, set nominally to a value that is a summation of the phase shifts associated with the transmit and control section 110, the coupler Cfb and the IQ demodulator. The in-phase demodulator DI and the quadrature phase demodulator DQ respectively employ the phase shifted in-phase carrier signal $\cos(\omega_c t+\phi)$ and the phase shifted quadrature phase carrier signal $\sin(\omega_c t+\phi)$ to provide the in-phase and quadrature phase feedback signals Ifb, Qfb.

The transmit and control section 110 includes a signal conditioning amplifier SC and a power amplifier PA that employ the input and feedback sections 105, 115 and a power control circuit PC to reduce distortion. The power amplifier PA exhibits a nonlinear, saturating output signal (e.g., voltage) characteristic for larger input signals (e.g., voltage signals). This transfer characteristic would tend to limit useful output power and create unacceptable distortion without employing the benefits of feedback. Distortion may be particularly acute, even with feedback, if the output signal 102 were allowed to limit or clip. The transmit and control section 110 includes the power control circuit PC, coupled to a vector monitor output 130, that ameliorates this situation.

The error detection circuit 122 includes first and second error amplifiers EAI, EAQ that provide first and second error signal components ESI, ESQ, which are coupled to the comparator circuit 126. The error detection circuit 122 also includes first and second delay lines DELI, DELQ and first and second attenuators ATTI, ATTQ. The error detection circuit 122 is coupled to the input signals Ia, Qa, and to the outputs of the operational amplifiers AMPIout and AMPQout and provides first and second error signal components ESI, ESQ based thereon. The first and second delay lines DELI, DELQ are adjusted to compensate for respective output signal delays associated with the first and second operational amplifiers AMPI, AMPQ. The first and second attenuators ATTI, ATTQ are adjusted to provide substantially zero values of first and second error signal components ESI, ESQ for small input signal excursions, under the condition that loop phase and loop gain have been corrected. Larger signal excursions will produce non-zero values of the first and second error signal components ESI, ESQ, due to the power amplifier PA deviating from its linear region.

The comparator circuit 126 includes first and second window comparators WCI, WCQ, a positive and negative reference parameter (e.g., voltage reference Vref) and a combiner C1 that provides the vector monitor output 130. The comparator circuit 126 defines a vector based on the first and second error signal components ESI, ESQ and controls a power level of the power amplifier PA based on the vector. When a non-zero value of the first or second error signal components ESI, ESQ exceeds either the positive or the negative value of the voltage reference Vref, the corresponding first or second window comparator WCI, WCQ provides a TRUE indication to the combiner C1. In the illustrated embodiment, the combiner C1 may be a two input OR-gate that provides a TRUE indication to the power control circuit PC when a lower output power or voltage at the output 102 is required. In an alternative embodiment of the present invention, the in-phase and quadrature phase input or feedback signals Ia, Qa, Ifb, Qfb may also be altered to provide a lower output power or voltage at the output 102.

Turning now to FIG. 2, illustrated is a vector diagram, generally designated 200, showing a vector and an exemplary vector locus as may be associated with an embodiment of a comparator circuit employing first and second window comparators such as was discussed with respect to FIG. 1. The vector diagram 200 employs axes representing a first error signal component ESI and a second error signal component ESQ, as shown. The vector diagram 200 includes a vector 205, first and second error signal component vectors $V_{ESI}$, $V_{ESQ}$ and a vector locus 210. The vector 205 is a resultant vector formed by the first and second error signal component vectors $V_{ESI}$, $V_{ESQ}$, which both have a magnitude that is slightly less than a positive value of a reference parameter (e.g., voltage reference Vref), at the time shown. The vector locus 210 provides an example of magnitude and direction that the vector 205 may manifest during operation.

Since both of these magnitudes of the first and second error signal component vectors $V_{ESI}$, $V_{ESQ}$ are below the voltage reference Vref, the comparator circuit would provide a NOT-TRUE (or FALSE) indication to a power control circuit. However, for the magnitudes of the first and second error signal component vectors $V_{ESI}$, $V_{ESQ}$ shown, the vector 205 has a magnitude slightly less than 1.4142 Vref. This indicates that an associated power amplifier may actually be in a mode of operation that is overdriven, if the voltage reference Vref is not appropriately sized. To prevent this condition in the associated power amplifier while using this comparator circuit, another reference parameter (e.g., voltage reference Vrefa) may be employed that has a value that is 0.707 Vref (i.e., (1/1.4142) Vref). Then, in a worst case, the magnitude of the vector 205 would exceed the voltage reference Vref only when both of the window comparators are providing a TRUE indication. The window comparators would provide a TRUE indication when the first or second error signal component vectors $V_{ESI}$, $V_{ESQ}$ exceeds 0.707 Vref. Although this solution prevents the power amplifier from being inadvertently overdriven, it would also prevent the power amplifier from being operated efficiently, near its maximum power level, much of the time.

Turning now to FIG. 3, illustrated is a system diagram of a transmitter, generally designated 300, employing in-phase and quadrature phase input and feedback signals including another embodiment of a vector monitor constructed in accordance with the principles of the present invention. The transmitter 300 includes an input 301 employing in-phase and quadrature phase input signals Ia, Qa, respectively, and an output 302. The transmitter 300 further includes an input section 305 coupled to the input 301, a transmit and control section 310 coupled between the input section 305 and the output 302, and a feedback section 315, coupled between the output 302 and the input 301, having a radio frequency (RF) feedback path 316 and a baseband feedback subsection 317. The transmitter 300 still further includes a vector monitor 320 having an error detection circuit 322 and a comparator circuit 326.

General operation of the transmitter 300 is the same as was discussed with respect to the transmitter 100 shown in FIG. 1. However, in this embodiment, the comparator circuit 326 includes a polar comparator PC1 coupled to a reference parameter (e.g., voltage reference Vref). The polar comparator PC1 alleviates the problem of inadvertently overdriving the power amplifier as was discussed with respect to FIG. 2. The polar comparator PC1 inherently provides a vector that is a resultant vector summation of a first error signal component ESI and a second error signal component ESQ. When the magnitude of this vector exceeds the voltage reference Vref, the comparator circuit 326 (i.e., the polar comparator PC1) provides a TRUE indication to a power control circuit PC. Operation of the polar comparator PC1 may be expressed in pseudo-code as:

IF SQRT ($ESI^2+ESQ^2$)>Vref,
THEN VECTOR MONITOR OUTPUT 330=TRUE,
ELSE VECTOR MONITOR OUTPUT 330=FALSE.

Employing the polar comparator PC allows selection of a voltage reference Vref such that a power amplifier PA may operate more closely to its saturation point.

Figure 4:
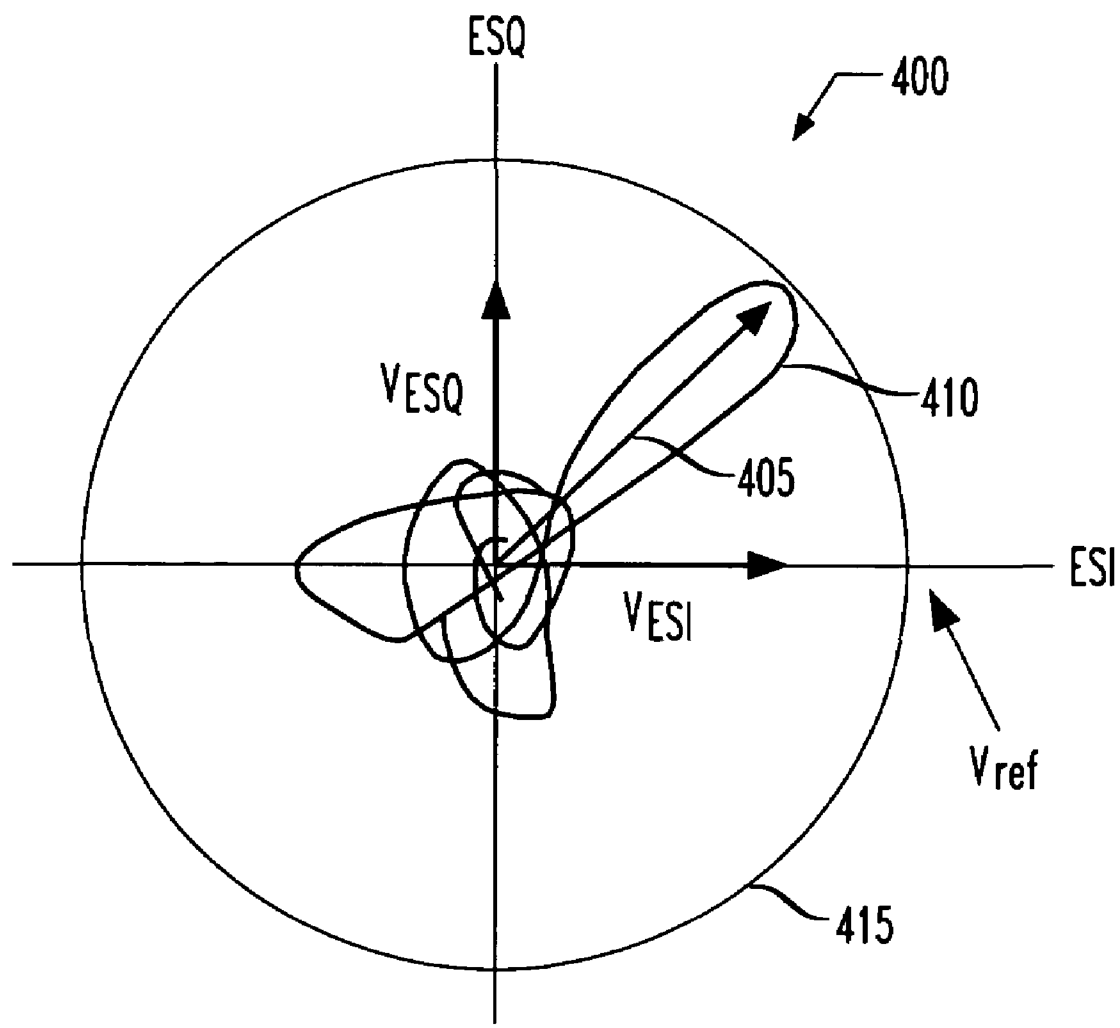
FIG. 4 illustrates a vector diagram showing a vector and an exemplary vector locus as may be associated with an embodiment of a comparator circuit employing a polar comparator such as was discussed with respect to FIG. 3.

Turning now to FIG. 4, illustrated is a vector diagram, generally designated 400, showing a vector and an exemplary vector locus as may be associated with an embodiment of a comparator circuit employing a polar comparator such as was discussed with respect to FIG. 3. The axes shown in the vector diagram 400 are employed to represent a first error signal component ESI and a second error signal component ESQ, as shown. First and second error signal component vectors $V_{ESI}$, $V_{ESQ}$ may be positioned along these axes and exemplary values for each are shown. A vector 405 is the vector summation of these two error signal component vectors $V_{ESI}$, $V_{ESQ}$. The vector locus 410 provides an example of magnitude and direction that the vector 405 may manifest during operation, as before.

A reference parameter (e.g., voltage reference Vref) may be represented as a circular boundary structure 415 for the vector 405, as shown. In the illustrated embodiment, the vector 405 may be seen to exceed the voltage reference Vref no later than either one of its first or second error signal component vectors $V_{ESI}$, $V_{ESQ}$. This allows the voltage reference Vref to be set at a value where a power amplifier PA may operate closer to its saturation point, thereby enhancing its efficiency while ameliorating its distortion. In an alternative embodiment, the voltage reference Vref may be represented by a geometric boundary structure, such as a polygon, that more closely approximates a circle than the square boundary structure associated with FIG. 2.

Figure 5:
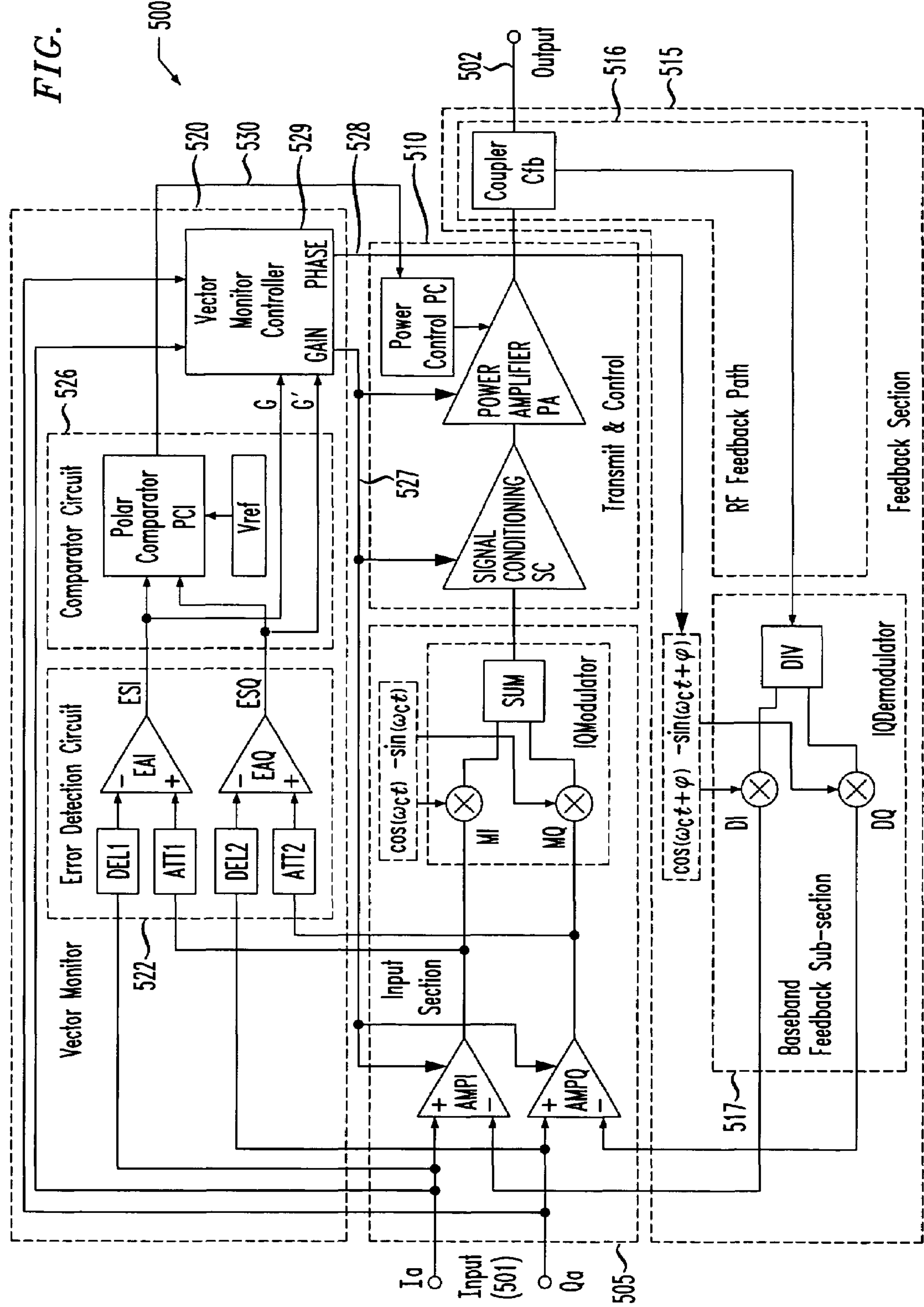
FIG. 5 illustrates a system diagram of another embodiment of a transmitter employing in-phase and quadrature phase input and feedback signals including an alternative embodiment of a vector monitor constructed in accordance with the principles of the present invention.

Turning now to FIG. 5, illustrated is a system diagram of another embodiment of a transmitter, generally designated 500, employing in-phase and quadrature phase input and feedback signals and an alternative embodiment of a vector monitor constructed in accordance with the principles of the present invention. The transmitter 500 includes an input 501 employing in-phase and quadrature phase baseband input signals Ia, Qa, respectively, and an output 502. The transmitter 500 further includes an input section 505 coupled to the input 501, a transmit and control section 510 coupled between the input section 505 the output 502 and a feedback section 515, coupled between the output 502 and the input 501, having a radio frequency (RF) feedback path 516 and a baseband feedback subsection 517. The transmitter 500 still further includes a vector monitor 520 having an error detection circuit 522, a comparator circuit 526 and a vector monitor controller 529.

General operation of the transmitter 500 is the same as was discussed with respect to the transmitter 300 shown in FIG. 3. However, in this embodiment, the vector monitor 520 includes the vector monitor controller 529, as shown. The vector monitor controller 529 is employed to facilitate correction of loop gain and phase errors that may typically occur due to output load changes associated with the transmitter 500. It may be appreciated that the vector monitor uses the input signal 501 as a test signal to perform the aforementioned corrections. Alternatively, a vector monitor output 530 is still employed to reduce distortion, as before. Inputs to the vector monitor controller 529 are provided by in-phase and quadrature phase input signals Ia, Qa and first and second error signal components ESI, ESQ. These signals are processed by the vector monitor controller 529 to produce a loop gain control correction signal 527 and a phase control correction signal 528, which will be discussed in more detail with respect to FIGS. 6, 7 and 8 below.

The vector monitor controller 529 may perform gain and phase error measurements without employing a math processor. To avoid a complicated Cartesian to polar conversion, a resultant error signal vector G, associated with the first and second error signal components ESI, ESQ, may be sampled at a time when a resultant input signal vector A, associated with the in-phase and quadrature phase input signals Ia, Qa, is proximate the real axis. This typically occurs when the quadrature phase input signal Qa is small compared to the in-phase input signal Ia. Then, for a given resultant error signal vector G having a small absolute value, the loop gain control correction signal 527 (loop gain error) may be approximately equal to the first error signal component ESI. Similarly, the phase control correction signal 528 (loop phase error) may be approximately equal to the second error signal components ESQ, since the resultant error signal vector G represents the inverse of the Cartesian feedback loop error.

In the illustrated embodiment, loop gain changes may be corrected in first or second operational amplifiers AMPI, AMPQ, signal conditioning amplifier SC or power amplifier PA. Loop phase changes may be corrected using a variable phase shifter placed between a local oscillator and a divider with quadrature outputs wherein the latter is connected to an IQ demodulator, which may be employed as a reference receiver. The vector monitor controller 529 may also be employed to use averaging to increase an accuracy of a measurement. Alternatively, the samples may be used directly, rather than employing an average, in cases where it may be advantageous such as correcting droop, which is a slow decay of a signal. It may also iteratively optimize the feedback loop as a semi-continuous process, perform correction adjustments in silent periods between transmissions or store obtained values for reuse during a sleep mode. Additionally, it may only take action if a certain bound is exceeded acting as a form of deliberate hysteresis. Examples may include corrective action for imperfections in the transmitter, for example when a loop phase change corrupts an in-phase/quadrature phase (I/Q) matching by maintaining a table of I/Q balance and phase or crosstalk correlation values as a function of loop phase setting.

Figure 6:
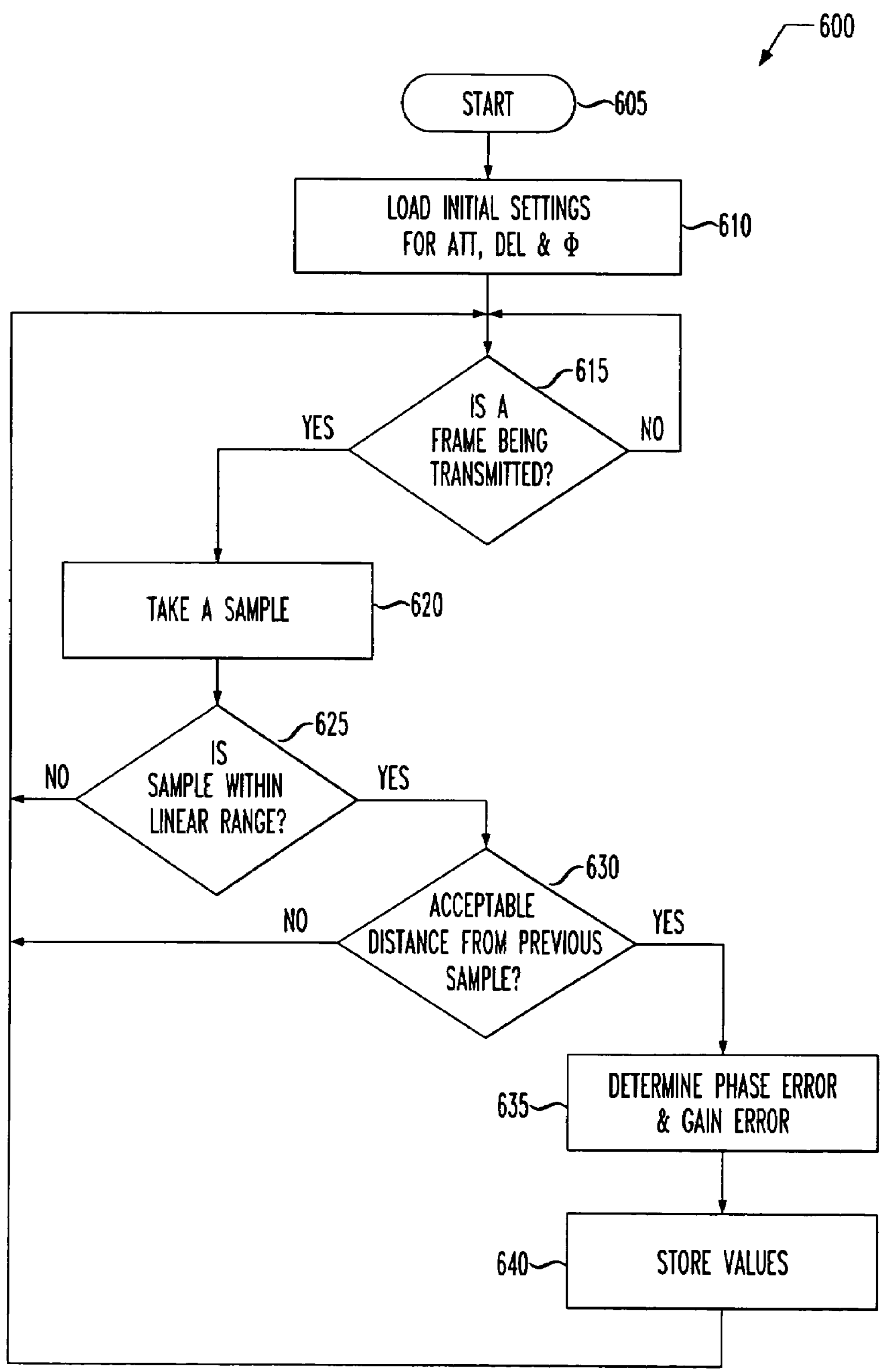
FIG. 6 illustrates a flow diagram of an embodiment of a method that may be employed by a vector monitor controller for determining a loop gain and phase error constructed in accordance with the principles of the present invention.

Turning now to FIG. 6 illustrated is a flow diagram of an embodiment of a method, generally designated 600, that may be employed by a vector monitor controller for determining a loop gain and phase error constructed in accordance with the principles of the present invention. The method 600 starts in a step 605 with an intent to determine and store gain and phase error information for use in correcting such errors. Initial or factory settings for delay DEL, attenuation ATT and phase $\phi$ are loaded in a step 610. Then, in a first decisional step 615, it is determined whether a frame is being transmitted. If a frame is being transmitted, a sample of an input signal vector consisting of in-phase and quadrature phase signals Ia, Qa is taken in a step 620.

In a second decisional step 625, it is determined whether the sample taken in the step 620 is within a region where the loop is expected to be linear. If the sample taken is within such a linear region, it is determined in a third decisional step 630 whether the sample taken is within an acceptably small distance from a previous sample. If it is, then in a step 635, amplitude and phase errors are determined between a sample of an error signal vector consisting of in-phase and quadrature phase error signals ESI, ESQ and the input signal vector consisting of in-phase and quadrature phase signals Ia, Qa. These amplitude and phase errors are converted to loop gain and phase correction information that is stored in a step 640 for use in further processing wherein the method 600 returns to the first decisional step 615 for continuation. The method 600 also returns to the first decisional step 615 if a frame is not being processed in the first decisional step 615, if the sample taken is beyond a linear region in the second decisional step 625, or the sample taken is beyond an acceptable distance from a previous sample in the third decisional step 630.

Figure 7:
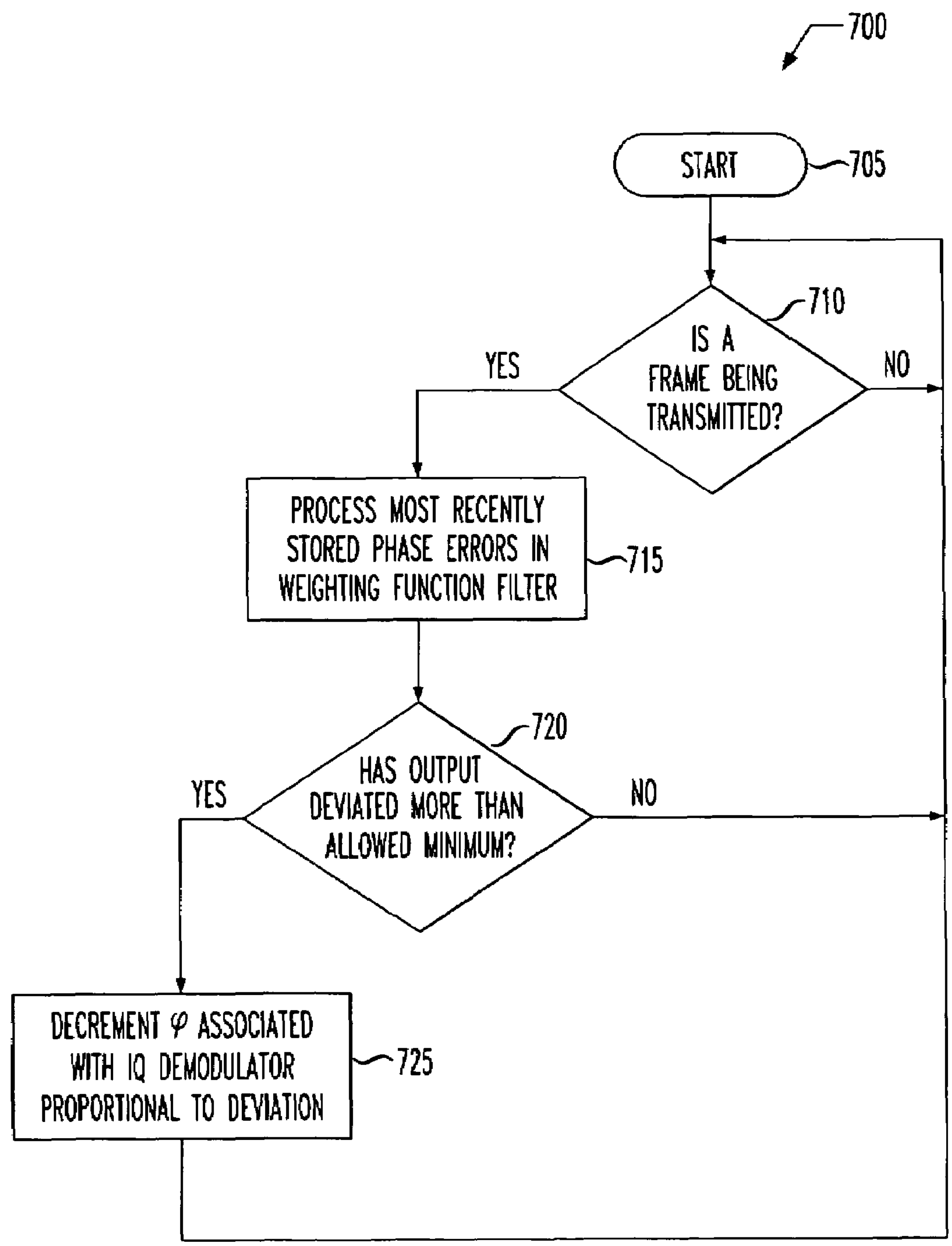
FIG. 7 illustrates a flow diagram of an embodiment of a method that may be employed by a vector monitor controller for correcting a feedback loop phase error constructed in accordance with the principles of the present invention.

Turning now to FIG. 7, illustrated is a flow diagram of an embodiment of a method, generally designated 700, that may be employed by a vector monitor controller for correcting a feedback loop phase error constructed in accordance with the principles of the present invention. The method 700 starts in a step 705 with an intent to correct a feedback loop phase error. In a first decisional step 710, it is determined whether a frame is being transmitted. If a frame is being transmitted, a number of the most recently stored values of phase error are processed using a weighting function filter.

Then, in a second decisional step 720, it is determined whether an output of the weighting function filter has deviated more than an allowed minimum. If the output has deviated more than the allowed minimum, a phase $\phi$ associated with an IQ demodulator, which may be regarded as a reference receiver, is decremented by an amount proportional to the deviation, and the method 700 returns to the step 710 for continuation. The method 700 also returns to the first decisional step 710 if a frame is not being processed in the first decision step 710 or if the output of the weighting function filter has not deviated more than an allowed minimum in the second decisional step 720.

Figure 8:
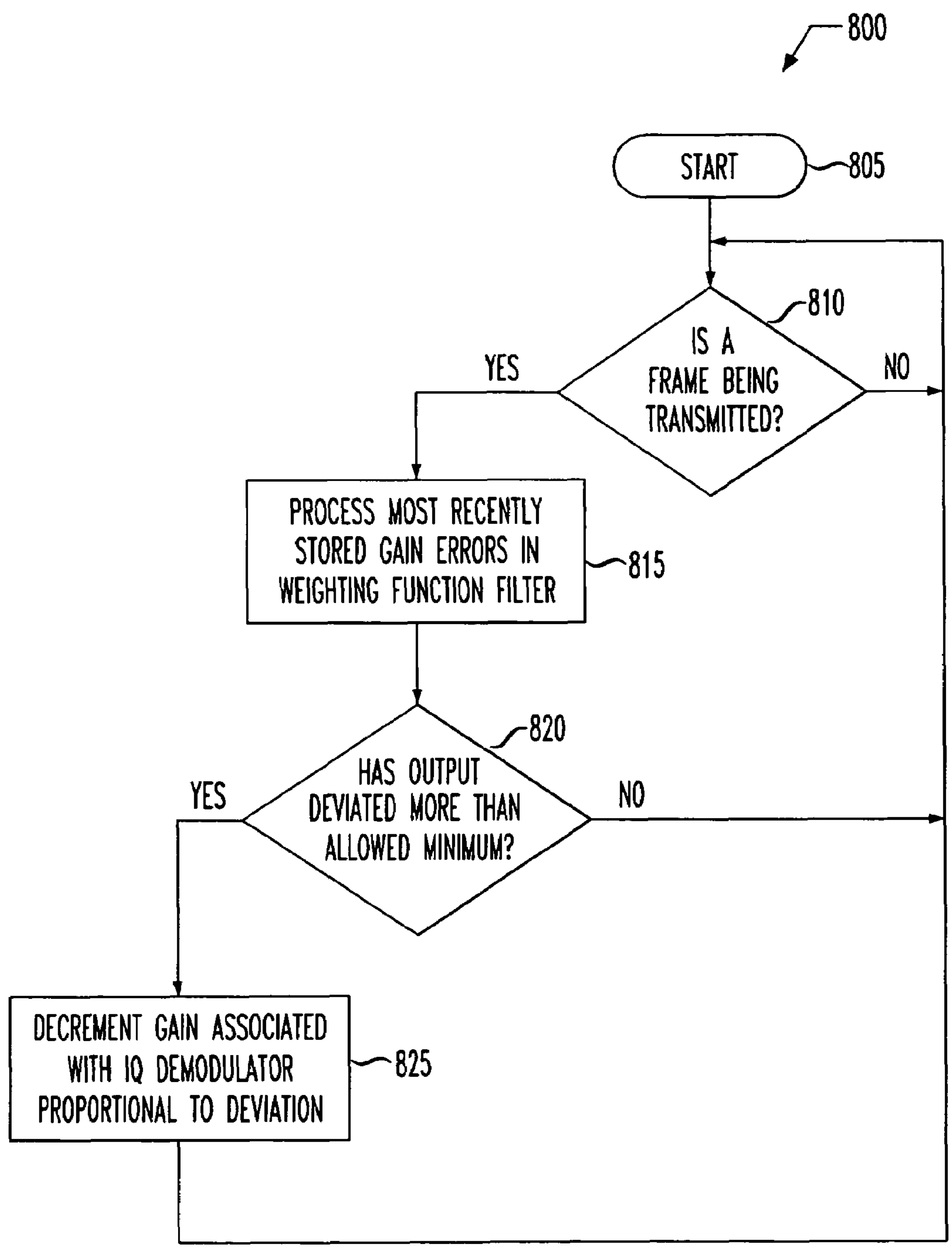
FIG. 8 illustrates a flow diagram of an embodiment of a method that may be employed by a vector monitor controller for correcting a feedback loop gain error constructed in accordance with the principles of the present invention.

Turning now to FIG. 8, illustrated is a flow diagram of an embodiment of a method, generally designated 800, that may be employed by a vector monitor controller for correcting a feedback loop gain error constructed in accordance with the principles of the present invention. The method 800 starts in a step 805 with an intent to correct a feedback loop gain error. In a first decisional step 810, it is determined whether a frame is being transmitted. If a frame is being transmitted, a number of the most recently stored values of gain error are processed using a weighting function filter.

Then, in a second decisional step 820, it is determined whether an output of the weighting function filter has deviated more than an allowed minimum. If the output has deviated more than the allowed minimum, a gain associated with an IQ demodulator, which may be regarded as a reference receiver, is decremented by an amount proportional to the deviation, and the method 800 returns to the first decisional step 810 for continuation. The method 800 also returns to the first decisional step 810 if a frame is not being processed in the first decisional step 810, or if the output of the weighting function filter has not deviated more than an allowed minimum in the second decisional step 820.

While the methods disclosed herein have been described and shown with reference to particular steps performed in a particular order, it will be understood that these steps may be combined, subdivided, or reordered to form an equivalent method without departing from the teachings of the present invention. Accordingly, unless specifically indicated herein, the order and/or the grouping of the steps are not limitations of the present invention.

In summary, embodiments of the present invention employing a vector monitor for use with a transmitter and a method of controlling a transmitter employing in-phase and quadrature phase (Cartesian) input and feedback signals have been presented. The vector monitor and method provide an error signal having first and second components based on the input signals and signals from operational amplifiers. The vector monitor also contains a comparator circuit that compares a resultant vector of the first and second components to a comparison boundary to control a power level of the transmitter based on the comparison. An embodiment of a vector monitor controller is also provided. Advantages include the detection and correction of distortion and the detection of amplitude and phase errors to allow alignment of loop gain and phase. These advantages allow operation at an enhanced power level with respect to a predefined distortion margin.

Although the present invention has been described in detail, those skilled in the art should understand that they can make various changes, substitutions and alterations herein without departing from the spirit and scope of the invention in its broadest form.

What is claimed is:

1. A vector monitor for use with a transmitter employing in-phase and quadrature phase input and feedback signals, comprising:

an error detection circuit configured to provide first and second components of an error signal based on said input and feedback signals; and a comparator circuit, coupled to said error detection circuit, configured to compare a resultant vector of said first and second components to a comparison boundary and control a power level of said transmitter based on said comparison.

2. The vector monitor as recited in claim 1 further comprising a vector monitor controller configured to provide corrected feedback loop gain and phase errors based on said input signals, and said first and second components of said error signal.

3. The vector monitor as recited in claim 1 wherein said error detection circuit comprises employing an input delay circuit.

4. The vector monitor as recited in claim 1 wherein said error detection circuit comprises employing an input attenuator circuit.

5. The vector monitor as recited in claim 1 wherein said comparator circuit comprises employing a window comparator.

6. The vector monitor as recited in claim 1 wherein said comparator circuit comprises employing a polar comparator.

7. The vector monitor as recited in claim 1 wherein said error detection circuit comprises employing a difference amplifier.

8. A method of controlling a transmitter employing in-phase and quadrature phase input and feedback signals, comprising:

providing first and second components of an error signal based on said input and feedback signals;

comparing a resultant vector of said first and second components to a comparison boundary; and controlling a power level of said transmitter based on said comparison.

9. The method as recited in claim 8 further comprising:

applying said in-phase and quadrature phase input and feedback signals to corresponding operational amplifiers;

receiving output signals from said operational amplifiers into said error detection circuit; and providing corrected feedback loop gain and phase errors based on said input signals, said output signals and said first and second components of said error signal.

10. The method as recited in claim 8 wherein said providing is performed by an error detection circuit comprising an input delay circuit.

11. The method as recited in claim 8 wherein said providing is performed by an error detection circuit comprising an input attenuator circuit.

12. The method as recited in claim 8 wherein said comparing is performed by a comparator circuit comprising a window comparator.

13. The method as recited in claim 8 wherein said comparing is performed by a comparator circuit comprising a polar comparator.

14. The method as recited in claim 8 wherein said providing is performed by an error detection circuit comprising a difference amplifier.

15. A transmitter, comprising:

an input section having first and second operational amplifiers that receive in-phase and quadrature phase input and feedback signals and provide first and second output signals, respectively;

a feedback section having in-phase and quadrature phase feedback signals;

a power amplifier that employs said input and feedback sections; and a vector monitor, including:

an error detection circuit that receives said input and output signals and provides first and second components of an error signal based thereon, and a comparator circuit, coupled to said error detection circuit, that compares a resultant vector of said first and second components to a comparison boundary and controls a power level of said power amplifier based on said comparison.

16. The transmitter as recited in claim 15 wherein said vector monitor further comprises a vector monitor controller that provides corrected feedback loop gain and phase errors based on said input signals, said output signals and said first and second components of said error signal.

17. The transmitter as recited in claim 15 wherein said error detection circuit comprises an input delay circuit.

18. The transmitter as recited in claim 15 wherein said error detection circuit comprises an input attenuator circuit.

19. The transmitter as recited in claim 15 wherein said comparator circuit comprises a window comparator.

20. The transmitter as recited in claim 15 wherein said comparator circuit comprises a polar comparator.

* * * * *